US008767299B2

(12) United States Patent
Liu et al.

(10) Patent No.: US 8,767,299 B2
(45) Date of Patent: Jul. 1, 2014

(54) EMBEDDED VERTICAL OPTICAL GRATING FOR HETEROGENEOUS INTEGRATION

(75) Inventors: Fei Liu, Mount Kisco, NY (US); Qiqing C. Quyang, Yorktown Heights, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 336 days.

(21) Appl. No.: 12/906,697

(22) Filed: Oct. 18, 2010

(65) Prior Publication Data

US 2012/0092771 A1    Apr. 19, 2012

(51) Int. Cl.
*G02B 5/18*   (2006.01)
*H01L 21/30*   (2006.01)

(52) U.S. Cl.
CPC *G02B 5/18* (2013.01); *H01L 21/30* (2013.01); *G02B 5/1866* (2013.01)
USPC .......................................... 359/566; 438/703

(58) Field of Classification Search
CPC ............... G02B 5/1866; G02B 5/1814; G02B 6/02152; G02B 6/02138; G02B 5/1861; G02B 26/0808; G02B 5/1828; G02B 5/1871; G02B 5/1857; G02B 5/1876; G02B 27/44; G02B 27/4211; G02B 5/32; G02B 26/0841; G02B 6/136; G02B 1/05; G02B 5/3033; C03C 17/10; C03C 2218/152; C03C 2217/213; C23C 14/10; H01S 5/12; H01S 5/1231; H01L 21/31116; H01L 21/31144; H01L 21/31138; H01L 21/32136; H01L 21/76224; H01L 21/76232; H01L 21/76202; H01L 21/763; H01L 27/14627
See application file for complete search history.

(56) References Cited

U.S. PATENT DOCUMENTS

| 5,770,465 | A * | 6/1998 | MacDonald et al. ............ 216/2 |
| 6,720,268 | B1 | 4/2004 | Laermer et al. |
| 6,890,450 | B2 | 5/2005 | Naydenkov et al. |
| 7,077,577 | B2 | 7/2006 | Trezza et al. |
| 7,151,883 | B2 | 12/2006 | Chen et al. |
| 7,687,916 | B2 | 3/2010 | Lake |
| 2002/0135876 | A1 * | 9/2002 | Holm et al. .................. 359/566 |
| 2003/0129837 | A1 * | 7/2003 | Enders ......................... 438/689 |
| 2007/0160321 | A1 | 7/2007 | Wu et al. |
| 2009/0153844 | A1 | 6/2009 | Peter et al. |

FOREIGN PATENT DOCUMENTS

WO    2010/034385 A1    4/2010

OTHER PUBLICATIONS

Y. Ezoe, et al. "Silicon Micro-Pore X-Ray Optics", Nuclear Instruments & Methods in Physics Research A, 2007, pp. 817-820, vol. 579, Elsevier B.V.

(Continued)

*Primary Examiner* — Stephone B Allen
*Assistant Examiner* — Jyotsna Dabbi
(74) *Attorney, Agent, or Firm* — Cantor Colburn LLP; Vazken Alexanian (57) ABSTRACT

An embedded vertical optical grating, a semiconductor device including the embedded vertical optical grating and a method for forming the same. The method for forming the embedded optical grating within a substrate includes depositing a hard mask layer on the substrate, patterning at least one opening within the hard mask layer, vertically etching a plurality of scallops within the substrate corresponding to the at least one opening within the hard mask layer, removing the hard mask layer, and forming an oxide layer within the plurality of scallops to form the embedded vertical optical grating.

2 Claims, 14 Drawing Sheets

(56) References Cited

OTHER PUBLICATIONS

Kristian Pontoppidan Larsen, "Micro Electro Mechanical Devices for Controlling Light", Ph.D. Thesis, Jun. 2005, pp. 1-146, MIC—Department of Micro- and Nanotechonology Technical University of Denmark.

Chienliu Chang, et al. "Etching Submicrometer Trenches by Using the Bosch Process and Its Application to the Fabrication of Antireflection Structures", Journal of Micromechanics and Microengineering, 2005, pp. 580-585, vol. 15, Institute of Physics Publishing, UK.

Pradep Dixit, et al. "High Aspect Ratio Vertical Through-Vias for 3D MEMS Packaging Applications by Optimized Three-Step Deep RIE", Journal of the Electrochemical Society, 2007, pp. H85-H91, vol. 155 No. 2, The Electrochemical Society.

* cited by examiner

EMBEDDED VERTICAL OPTICAL GRATING FOR HETEROGENEOUS INTEGRATION

BACKGROUND

The present invention relates to optical gratings, and more specifically, to embedded vertical optical gratings in heterogeneous integration.

To further improve the performance of computational systems, it is desired to integrate optoelectronic devices and Micro-Electro-Mechanical Systems (MEMS) with Complementary metal-oxide-semiconductor (CMOS) devices into a micro-system. With three-dimensional integration (3DI) becoming a technology offering, it become becomes feasible to achieve the heterogeneous integrated micro-system.

In optoelectronics, one useful component is an optical grating. Gratings are optical devices used to achieve wavelength-dependent characteristics by means of optical interference effects. Optical gratings are used to achieve filtering, coupling, or mode transforming functions for the optoelectronics. Currently, semiconductor gratings are typically implemented on surface of a substrate by etching a grating pattern into the surface of the semiconductor guide (which may then be buried following subsequent deposition) to have a periodic change of reflective index.

SUMMARY

The present invention embodiments provide an embedded vertical optical grating to achieve better inter-layer optical communication and preserve chip area. Vertical optical gratings act as a key component for the heterogeneous integrated micro-system.

According to one embodiment of the present invention, a method for forming an embedded optical grating within a substrate is provided. The method includes depositing a hard mask layer on the substrate, patterning at least one opening within the hard mask layer, vertically etching a plurality of scallops within the substrate corresponding to the at least one opening within the hard mask layer, removing the hard mask layer, and forming an oxide layer within the plurality of scallops to form the embedded vertical optical grating.

According to yet another embodiment of the present invention, a semiconductor device is provided. The semiconductor device includes a substrate, one or more dielectric layers formed on the substrate, and at least one vertical optical grating embedded within the substrate, the vertical optical grating comprising a plurality of scallops vertically etched within the substrate and formed of an oxide material.

According to yet another embodiment of the present invention, a vertical optical grating is provided. The vertical optical grating includes a plurality of scallops vertically etched within a semiconductor substrate and formed of an oxide material.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
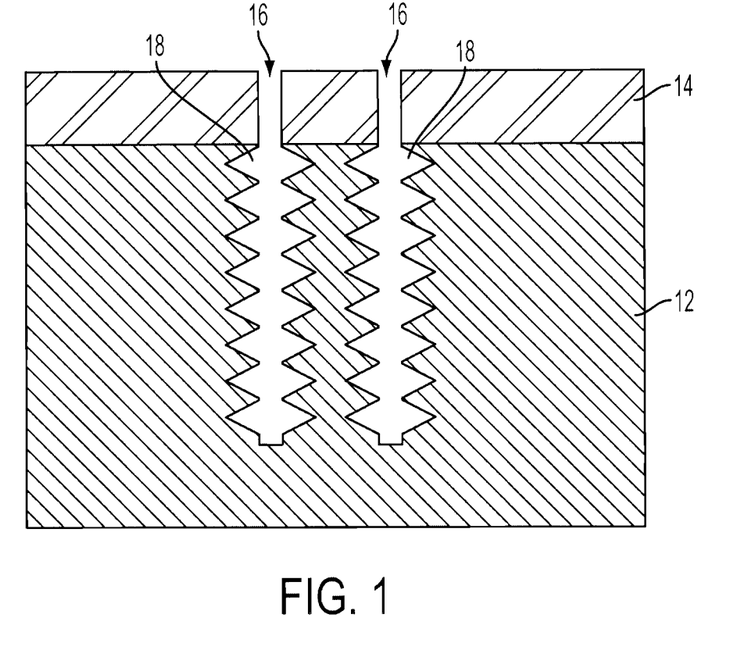
FIG. 1 is a diagram illustrating a vertical etching operation for forming a plurality of scallops of an optical grating that can be implemented within embodiments of the present invention.

An optical grating is an optical component with a periodic structure, which splits and diffracts light into several beams travelling in different directions. The directions of these beams depend on the spacing of the grating and the wavelength of the light so that the grating acts as the dispersive element. According to an embodiment of the present invention, an optical grating may be used for different optical functions such as filtering, coupling, and mode transforming, for example. FIG. 1 is a diagram illustrating a vertical etching operation for forming a plurality of scallops of an optical grating that can be implemented within embodiments of the present invention. As shown in FIG. 1, a substrate 12 is provided. The substrate 12 may be a semiconductor substrate, a semiconductor substrate including semiconductor devices such as transistors, resistors, and capacitors, for example. The semiconductor substrate may be formed of silicon (Si) or the like. A hard mask layer 14 is deposited on the substrate 12. The hard mask layer 14 may be a single layer formed of silicon dioxide, silicon nitride, or multi-layered. Alternatively, the hard mask layer 14 may be formed of a metal, a metal nitride, a metal oxide. The hard mask layer 14 is used for performing an etching operation to form an optical grating according to an embodiment of the present invention. The hard mask layer 14 is patterned using a photolithography technique, thereby etching a plurality of openings 16 within the hard mask layer 14. The remaining hard mask layer 14 is used to protect the underlying substrate 12 during subsequent processing steps such as etching. A process for forming an optical grating according to an embodiment of the present invention will now be described.

Next, in FIG. 1, an etching operation is performed to form a plurality of scallops 18 within the substrate 12. The plurality of scallops 18 is formed by vertical etching within an area of the substrate 12 corresponding to the openings 16 of the hard mask layer 14. The vertical etching is performed by using an isotropic dry etching process such as a Bosch process. A Bosch process involves alternating between two processes (e.g., an etching process and a deposition process) repeatedly to achieve nearly vertical structures as shown in FIG. 1. The Bosch process includes introducing a first gas that etches the substrate 12 and then a second gas that creates a protective liner along the surface of the sidewalls of the substrate 12. The first gas is then reintroduced, and removes the protective liner along the bottom of the recess and continues etching the substrate 12 along the bottom of the recess. The process is repeated to form the scallops 18 until a desired depth is achieved. According to an embodiment of the present invention, the period of the scallops 18 is determined by the switch frequency between the etching process and the deposition process. The amplitude of the scallops 18 may be tuned by changing the Bosch etching chemical condition. Therefore, the appearance of the scallops may vary as needed. Variations of the formation of the scallops 18 will be discussed later with reference to FIGS. 10 and 11.

Figure 2:
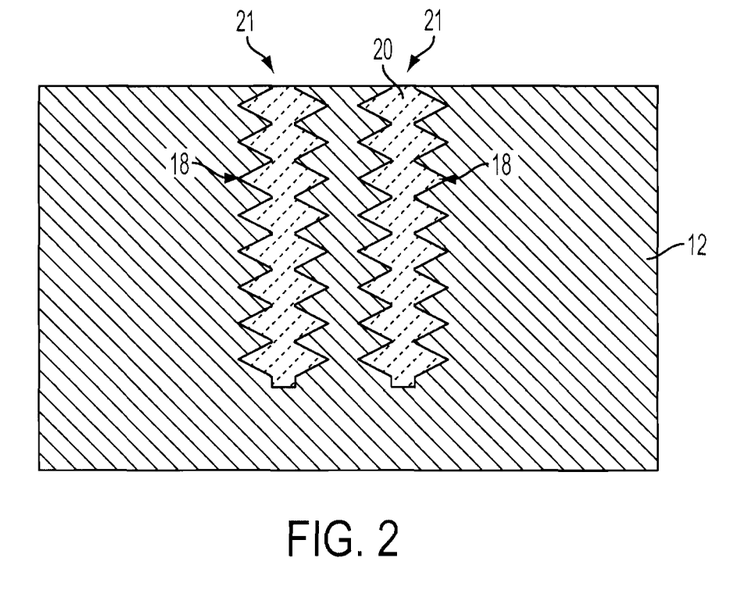
FIG. 2 is a diagram illustrating a deposition operation for forming an oxide layer within the plurality of scallops shown in FIG. 1 that can be implemented within embodiments of the present invention.

FIG. 2 is a diagram illustrating a deposition operation for forming an oxide layer within the plurality of scallops shown in FIG. 1 that can be implemented within embodiments of the present invention. As shown in FIG. 2, the hard mask layer 14 is etched away and a thermal oxide layer 18 is formed within the scallops 18 to form the embedded optical grating 21. The oxide layer 18 may be formed by depositing an oxide material within the scallops 18 or by thermally growing the oxide material within the scallops 18. The embedded optical grating 21 according to this embodiment of the present invention may be utilized to couple light in or out of a waveguide, to drop off or add on a certain optical mode into an optical signal, to filter broad band optical spectra, or to provide a phase match for an optical mode transformation, for example.

Figure 3:
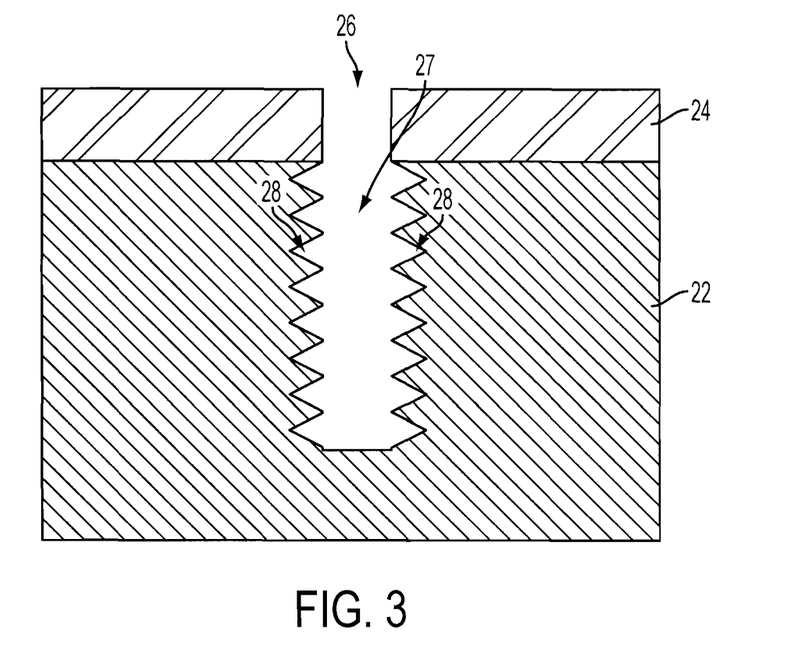
FIG. 3 is a diagram illustrating a vertical etching operation for forming a plurality of scallops of an optical grating that can be implemented within alternative embodiments of the present invention.

Another optical grating that can be implemented within alternative embodiments of the present invention will now be described below with reference to FIGS. 3 through 5. FIG. 3 is a diagram illustrating a vertical etching operation for forming a plurality of scallops of an optical grating that can be implemented within alternative embodiments of the present invention. As shown in FIG. 3, a substrate 22 is provided. A hard mask layer 24 is formed on the substrate 22. The hard mask layer 24 is patterned to form an opening 26. A vertical etching operation (i.e., a Bosch reactive ion etching (RIE) operation) is performed to create an opening 27 within the substrate 22. The opening 27 corresponds with the opening 26 within the hard mask layer 24. A plurality of scallops 28 is formed along sidewalls of the opening 27.

Figure 4:
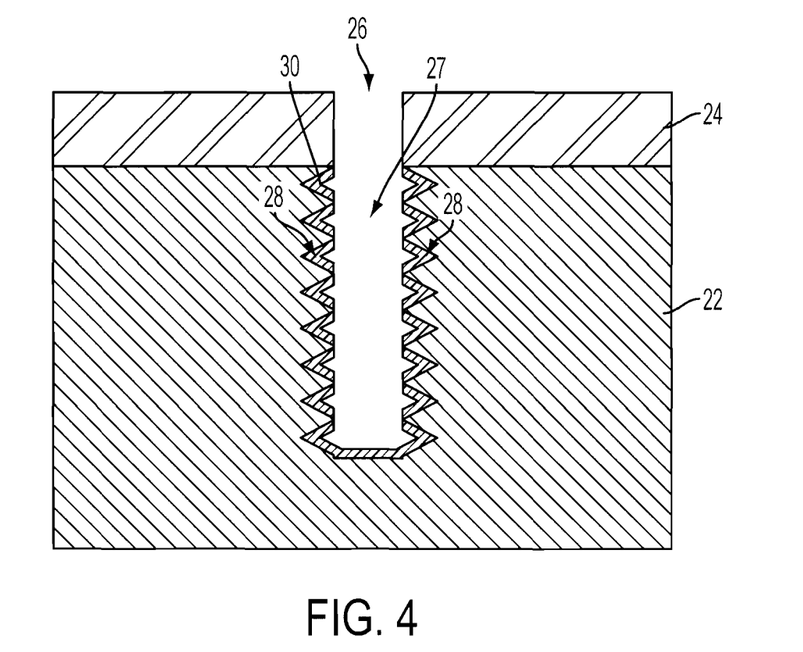
FIG. 4 is a diagram illustrating a deposition operation of an oxide layer along a plurality of scallops of the optical grating shown in FIG. 3 that can be implemented within embodiments of the present invention.
Figure 5:
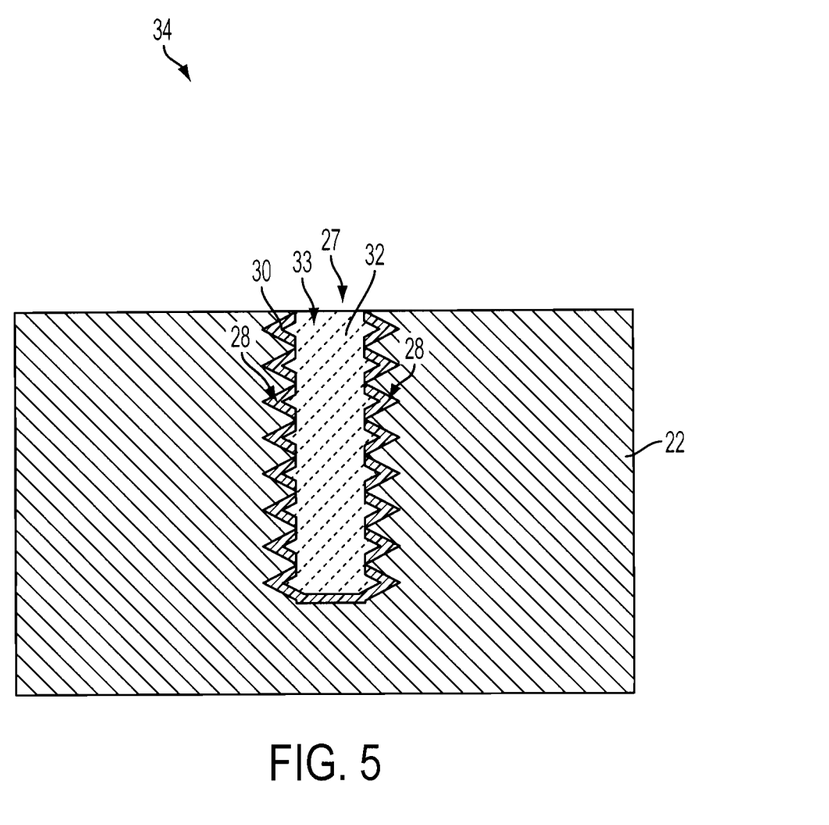
FIG. 5 is a diagram illustrating a deposition operation for forming a core layer of the optical grating shown in FIG. 3 that can be implemented within embodiments of the present invention.

FIG. 4 is a diagram illustrating a deposition operation of an oxide layer along a plurality of scallops of the optical grating shown in FIG. 3 that can be implemented within embodiments of the present invention. As shown in FIG. 4, an oxide layer 30 is then formed along the scallops 28. As mentioned above, the oxide layer 30 may be formed by deposition or thermal growth of an oxide material on the scallops 28. Next, FIG. 5 is a diagram illustrating a deposition operation for forming a core layer of the optical grating shown in FIG. 3 that can be implemented within embodiments of the present invention. As shown in FIG. 5, the remaining hard mask layer 24 is removed and a fill material 32 formed of nitride or polysilicon, for example, is used to form a core layer 33 within the opening 27. A chemical polishing (CMP) operation may then be performed to planarize the fill material 32. The scallops 28 then transfer to the core layer 33. Thus, an embedded optical grating 34 is achieved. The optical grating 34 may be used to couple light in or out of waveguide, to drop off or add on a certain optical mode into optical signal, to filter broad band optical spectra, or to provide phase match for optical mode transformation, for example. Examples of optical functions of the embedded optical grating 34 will be described further below with reference to FIGS. 13 through 16.

An optical grating that can be implemented within alternative embodiments of the present invention will now be described below with reference to FIGS. 6 through 9.

Figure 6:
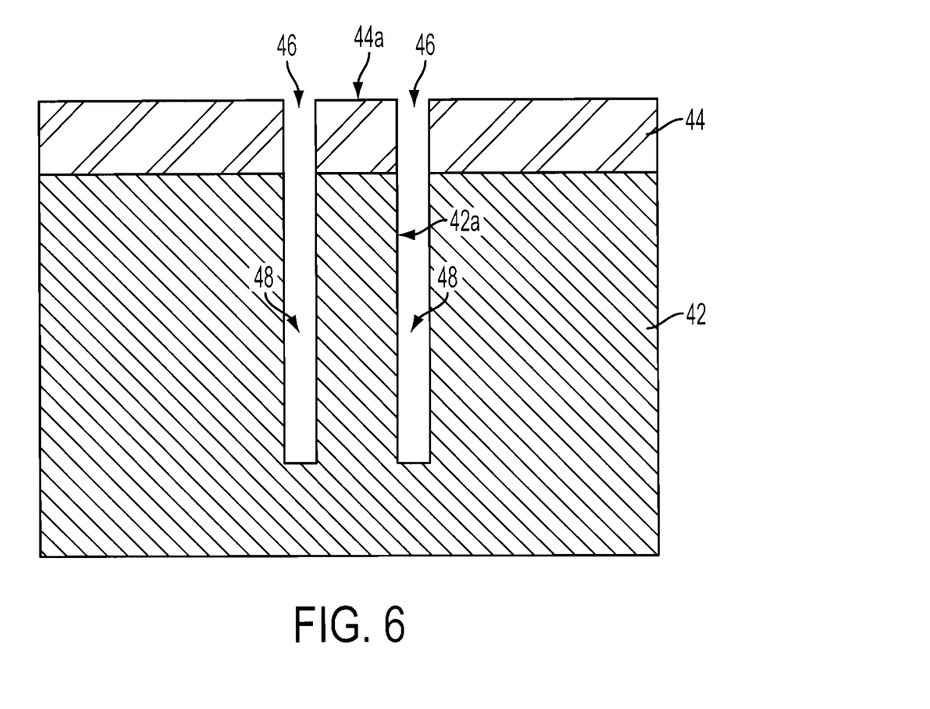
FIG. 6 is a diagram illustrating an etching operation of a pair of openings within a substrate for forming an optical grating that can be implemented within alternative embodiments of the present invention.

FIG. 6 is a diagram illustrating an etching operation of a pair of openings within a substrate for forming an optical grating that can be implemented within alternative embodiments of the present invention. As shown in FIG. 6, a substrate 42 is provided. A hard mask layer 44 is formed on a surface of the substrate 42. The hard mask layer 44 is patterned to include a pair of openings 46 such that a center portion 44a of the hard mask layer 44 remains between the pair of openings 46. An etching operation (e.g., a Bosch RIE operation) is performed to form a pair of openings 48 within the substrate 42, corresponding to the pair of openings 46 of the hard mask layer 44. As a result, a portion 42a of the substrate 42 remains between the pair of openings 48. The pair of openings 46 may be formed of a predetermined depth and/or width. The predetermined depth ranges from approximately several microns to approximately several hundreds microns. The predetermined width ranges from tenth of a micron to several microns.

Figure 7:
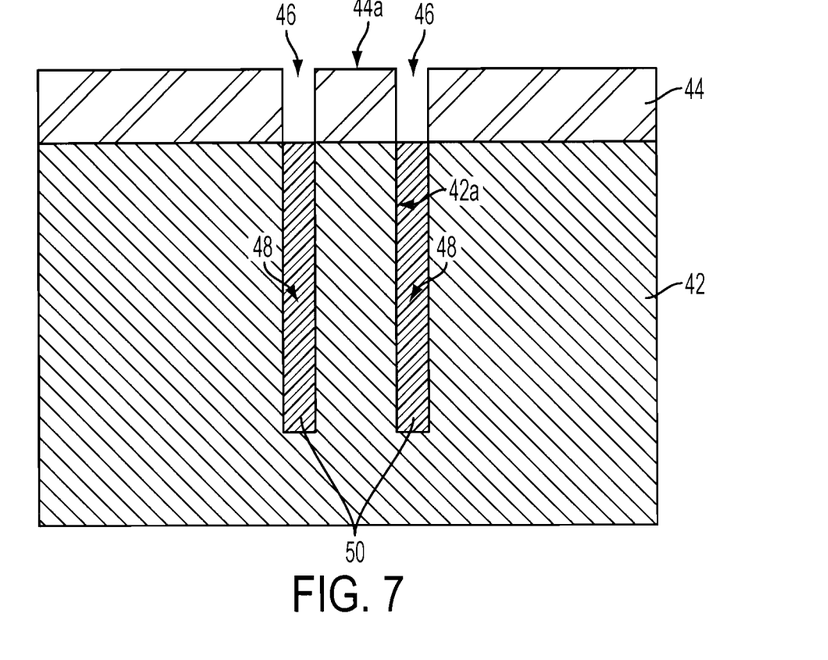
FIG. 7 is a diagram illustrating a deposition operation for forming a cladding layer within the pair of openings shown in FIG. 6 that can be implemented within alternative embodiments of the present invention.

FIG. 7 is a diagram illustrating a deposition operation for forming a cladding layer within the pair of openings shown in FIG. 6 that can be implemented within alternative embodiments of the present invention. As shown in FIG. 7, an oxide layer 50 is formed within the pair of openings 48 of the substrate 42. According to an embodiment of the present invention, the oxide layers 50 are formed by deposition or thermal growth of an oxide material within the openings 48. This forms a cladding layer for forming an optical grating. Next, the formation of a plurality of scallops for the optical grating will now be discussed with reference to FIG. 8.

Figure 8:
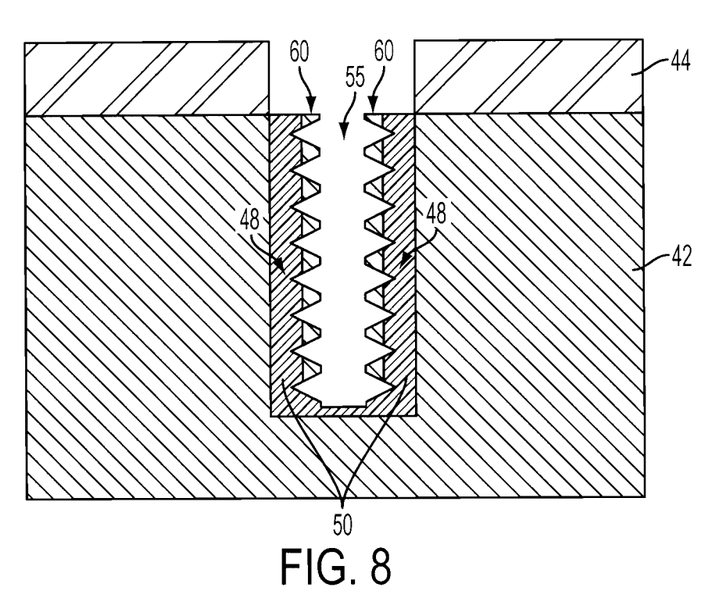
FIG. 8 is a diagram illustrating a vertical etching operation for forming a plurality of scallops of an optical grating that can be implemented within alternative embodiments of the present invention.

FIG. 8 is a diagram illustrating a vertical etching operation for forming a plurality of scallops of an optical grating that can be implemented within alternative embodiments of the present invention. As shown in FIG. 8, the portion 44a of the hard mask layer 44 is etched away and the portion 42a of the substrate 42 between the oxide layers 50 is etched away via a Bosch RIE operation to form an opening 55 comprising a plurality of scallops 60 at sidewalls thereof. According to one embodiment of the present invention, outer edges of the scallops 60 are formed within the oxide layers 50. A process of forming a core layer for the optical grating will now be discussed below with reference to FIG. 9.

Figure 9:
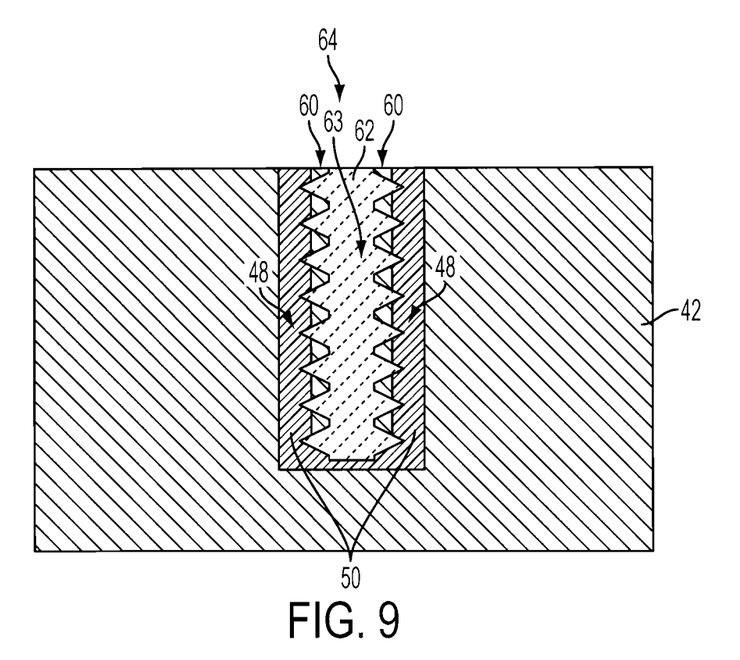
FIG. 9 is a diagram illustrating a deposition operation for forming a core layer of the optical grating that can be implemented within alternative embodiments of the present invention.

FIG. 9 is a diagram illustrating a deposition operation for forming a core layer of the optical grating that can be implemented within alternative embodiments of the present invention. As shown in FIG. 9, the remaining hard mask layer 44 is removed. A fill material 62 is deposited within the opening 55 within the substrate 42. A CMP operation is then performed to planarize the fill material 62, to thereby form a core layer 63. The scallops 60 are then transferred to the core layer 63 as shown in FIG. 9. As a result of the operations in FIGS. 6 through 9, an optical grating 64 is achieved. The optical grating 64 may be used to couple light in or out of a waveguide, to drop off or add on a certain optical mode into an optical signal, to filter broad band optical spectra, or to provide a phase match for an optical mode transformation, for example.

Figure 10:
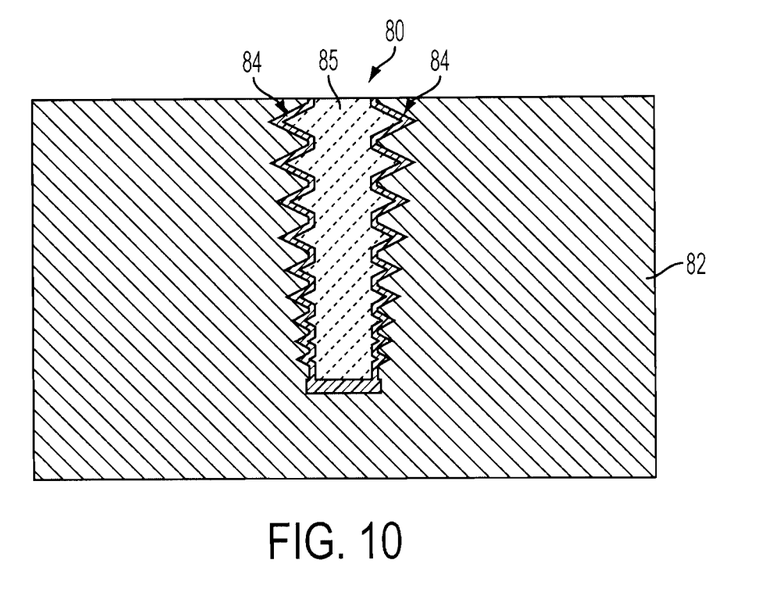
FIG. 10 is a diagram illustrating an example of scallop formation that can implemented within embodiments of the present invention.
Figure 11:
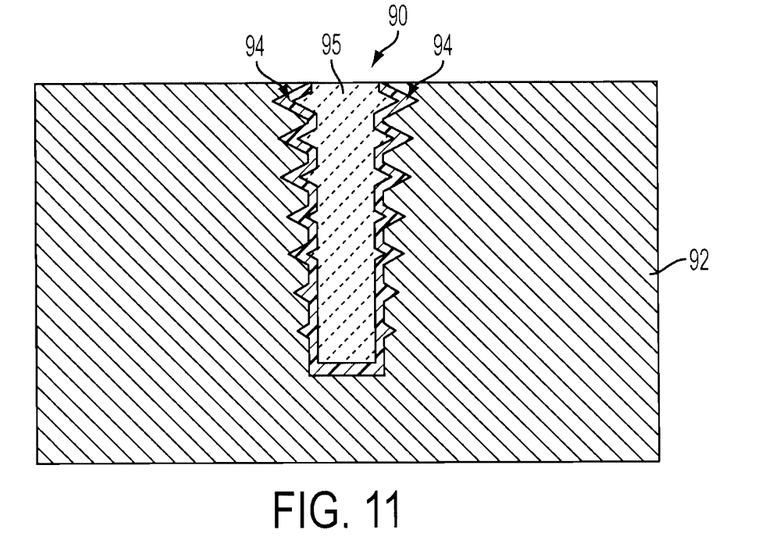
FIG. 11 is a diagram illustrating another example of scallop formation that can be implemented within embodiments of the present invention.

As mentioned above, the amplitude and period of the scallops shown in FIGS. 1 through 9 may be varied based on changes in processing conditions. FIG. 10 is a diagram illustrating an example of scallop formation that can implemented within embodiments of the present invention. FIG. 11 is a diagram illustrating another example of scallop formation that can be implemented within embodiments of the present invention.

For example, as shown in FIG. 10, by varying the processing conditions, an embedded optical grating 80 may be formed within a substrate 82. The optical grating 80 includes a core layer 85 formed of a nitride or polysilicon fill material that includes a plurality of scallops 84 that varies in vertical chirp amplitude. As shown in FIG. 10, the plurality of scallops 84 vary in sizes increasing from a bottom of the core layer 85 within the substrate 82 to a top surface of the substrate 82. As shown in FIG. 11, an embedded optical grating 90 includes a core layer 95 formed of a nitride or polysilicon fill material, for example within a substrate 92. The core layer 95 includes a plurality of scallops 94 that vary in distance apart and size. This is formed by varying the frequency between the etching and deposition operations when forming the scallops 94. Therefore, the present invention is not limited to the plurality of scallops of an optical grating being of a particular shape and/or size. The optical gratings shown in FIGS. 1 through 9 may be implemented in various different ways as shown in FIGS. 12 through 15.

Figure 12:
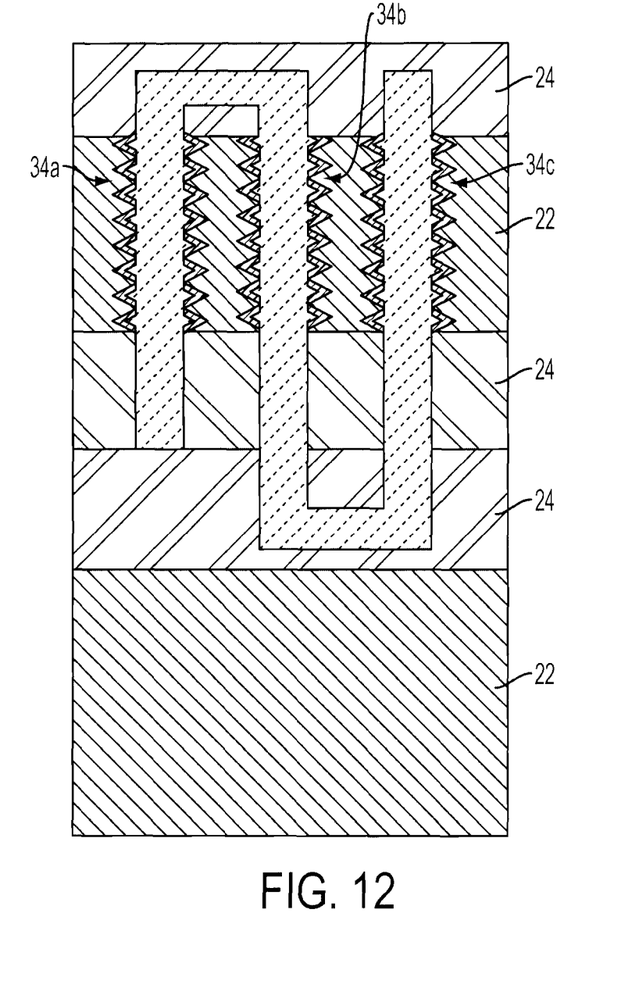
FIG. 12 is a diagram illustrating multiple optical gratings in series that can be implemented within embodiments of the present invention.

FIG. 12 is a diagram illustrating multiple optical gratings in series that can be implemented within embodiments of the present invention. As shown in FIG. 12, a plurality of optical gratings 34a, 34b, and 34c are formed in series. These optical gratings 34a, 34b, 34c are formed together using a bonding process. As shown in FIG. 12, a plurality of substrates 22 are provided and dielectric layers 24 are formed on the substrates 22 including the embedded optical gratings 34a, 34b, 34c are bonded together. The optical gratings 34a, 34b, 34c formed in series may be utilized for optical coupling within a semiconductor device, for example.

Figure 13:
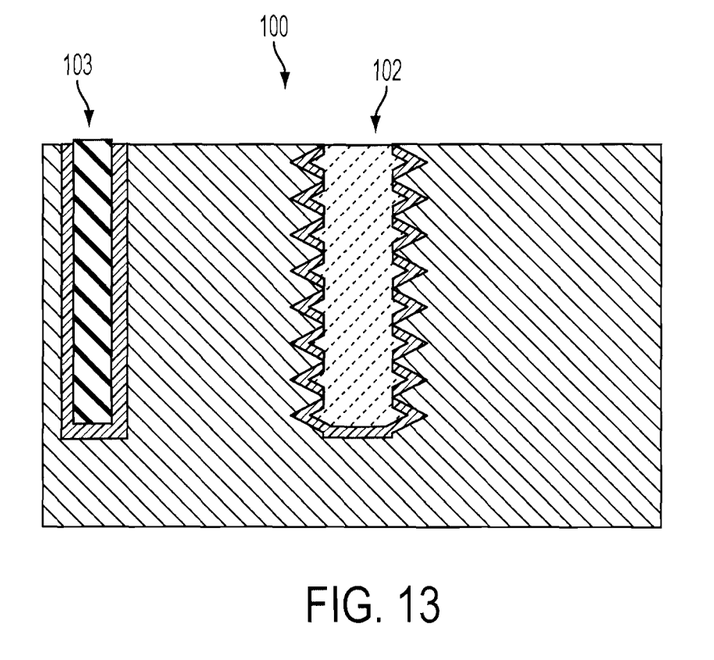
FIG. 13 is a diagram illustrating an example of a vertical optical grating embedded within a semiconductor device according to embodiments of the present invention.

FIG. 13 is a diagram illustrating an example of a vertical optical grating embedded within a semiconductor device that can be implemented within embodiments of the present invention. As shown in FIG. 13, a semiconductor device 100 is provided. The semiconductor device 100 includes an optical grating 102 formed within a substrate 101. The optical grating 102 is similar to the optical grating 34 shown in FIG. 5. A through-silicon via (TSV) 103 is also formed within the substrate 101. The optical grating 34 may be provided to perform optical filtering within this embodiment of the present invention.

Figure 14:
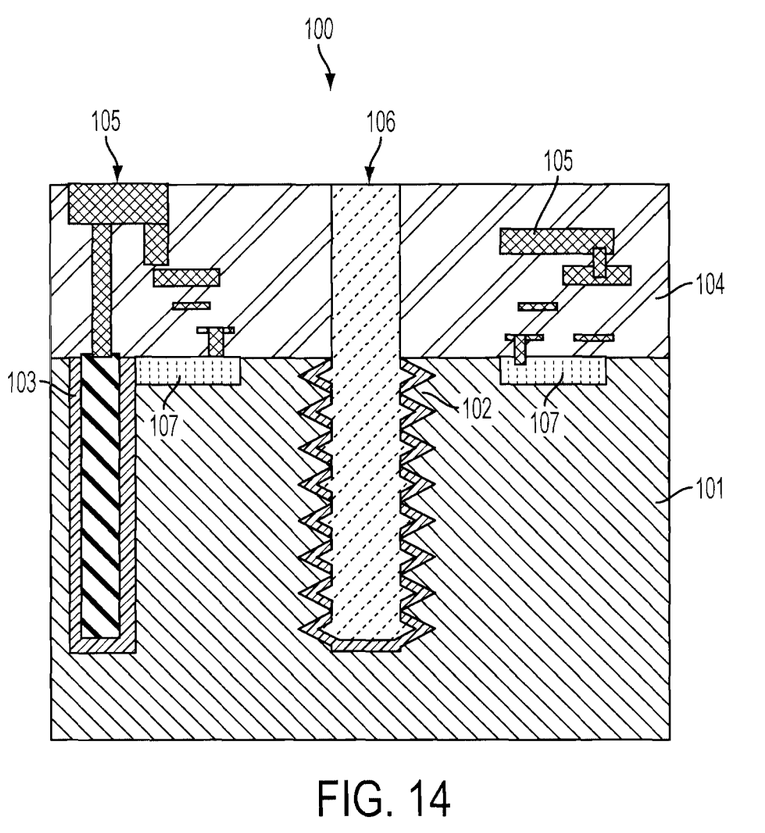
FIG. 14 is a diagram illustrating another example of a vertical optical grating embedded within a semiconductor device that can be implemented within embodiments of the present invention.

FIG. 14 is a diagram illustrating another example of a vertical optical grating embedded within a semiconductor device that can be implemented within embodiments of the present invention. As shown in FIG. 14, active circuitry 107 on the substrate 101 may be formed using complementary metal-oxide-semiconductor devices connected by interconnect 105. A fill material 106 formed of nitride or polysilicon is deposited within the dielectric layer 104 forming a cladding layer, to thereby form an optical waveguide.

Figure 15:
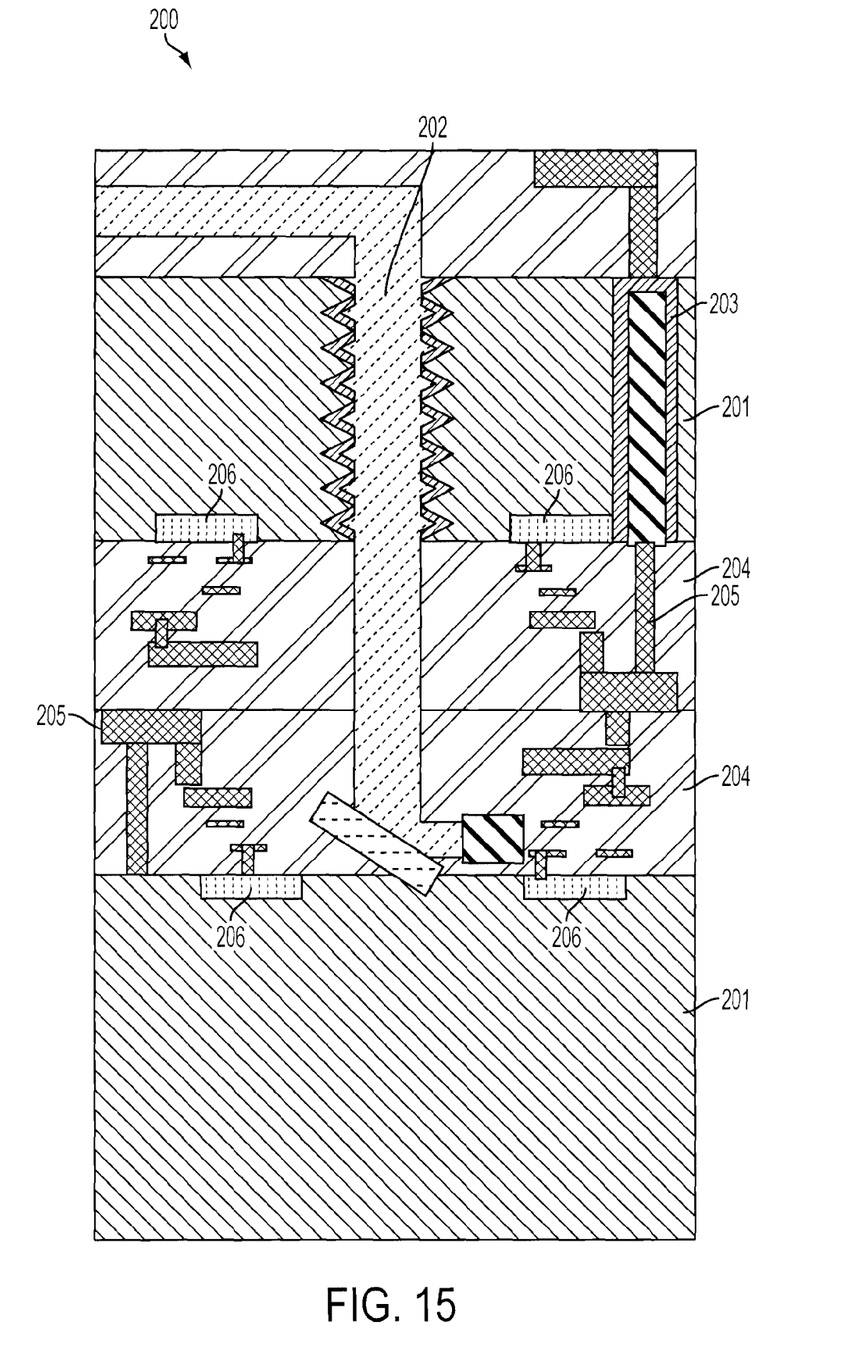
FIG. 15 is a diagram illustrating another example of a vertical optical grating embedded within a semiconductor device that can be implemented within embodiments of the present invention.

FIG. 15 is a diagram illustrating another example of a vertical optical grating embedded within a semiconductor device that can be implemented within embodiments of the present invention. As shown in FIG. 15, an optical grating 202 is embedded within a semiconductor device 200. A TSV 203 is also formed within the semiconductor device 200. The semiconductor device 200 includes a substrate 201 having a plurality of dielectric layers 204 including a plurality of electronic components 205 and 206. The optical grating 202 is used as an optical waveguide, an optical coupler for branching or coupling an optical signal and backside metal wiring within complementary metal-oxide-semiconductor (CMOS) technology, Optical and Micro-Electro-Mechanical Systems (MEMs) heterogeneous integration.

Embodiments of the present invention provide an embedded vertical optical grating having a plurality of scallops at sidewalls thereof formed, via a Bosch process for example, to achieve better inter-layer optical communication and preserve chip area.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for forming an embedded optical grating within a substrate, the method comprising:
    depositing a hard mask layer on the substrate;
    patterning a first pair of openings within the hard mask layer and a second pair of openings within the substrate corresponding with the first pair of openings;
    filling the second pair of openings with an oxide layer;
    removing a portion of the hard mask layer between the second pair of openings;
    with a remaining portion of the hard mask layer in place, vertically etching a center opening within the substrate between the second pair of openings and a plurality of scallops at sidewall edges of the center opening, wherein outer edges of the plurality of scallops are formed within the oxide layer; and
    completely filling the center opening and the plurality of scallops with a core layer material to form the embedded vertical optical grating.

2. The method of claim 1, wherein the oxide layer comprises a cladding layer for the embedded vertical optical grating.

* * * * *